United States Patent [19]

Moss et al.

[11] Patent Number: 5,262,195
[45] Date of Patent: Nov. 16, 1993

[54] SOLUBLE CONDUCTING POLYMERS AND THEIR USE IN MANUFACTURING ELECTRONIC DEVICES

[75] Inventors: Mary G. Moss; Terry L. Brewer; Tony D. Flaim, all of Rolla, Mo.

[73] Assignee: Brewer Science, Rolla, Mo.

[21] Appl. No.: 958,286

[22] Filed: Oct. 7, 1992

Related U.S. Application Data

[63] Continuation of Ser. No. 608,714, Nov. 5, 1990, abandoned.

[51] Int. Cl.$^5$ .............................................. C23C 26/00
[52] U.S. Cl. .................................. 427/101; 427/102; 427/103; 427/240
[58] Field of Search ................ 427/101, 102, 103, 240

[56] References Cited

U.S. PATENT DOCUMENTS

| | | | |
|---|---|---|---|
| 4,798,685 | 1/1989 | Yaniger | 528/422 |
| 4,822,638 | 4/1989 | Yaniger | 427/79 |
| 4,851,487 | 7/1989 | Yaniger | 252/500 |

OTHER PUBLICATIONS

Gregg P. Kittlesen et al "Chemical Derivatization of Microelectrode Arrays by Oxidation of Pyrrole and N-Methylpyrrole: Fabrication of Molecule-Based Electronic Devices" J. Am. Chem. Soc. 106, 1984, pp. 7389-7396.

Alan G. MacDiarmid et al "Polyaniline: Protonic Acid Doping to the Metallic Regime" Mol. Cryst. Liq. Cryst. vol. 125, 1985 pp. 309-318.

David Macinnes, Jr. et al "Poly-O-Methoxyaniline: A New Soluble Conducting Polymer" Synthetic Metals 25 (1988), 235-242.

Suzhen Li et al "Soluble Polyaniline" Synthetic Metals, 20 (1987), 141-149.

Y. Cao et al "Spectroscopic Studies of Polyaniline in Solution and in Spin-Cast Films" Synthetic Metals 32 (1989), 263-281.

Marie Angelopoulos et al "Polyaniline: Processability From Aqueous Solutions and Effect of Water Vapor on Conductivity" Synthetic Metals, 21 (1987), 21-30.

*Primary Examiner*—Shrive Beck
*Assistant Examiner*—Vi Duong Dang
*Attorney, Agent, or Firm*—Veo Peoples, Jr.

[57] ABSTRACT

Soluble conducting polymers from substituted polyanilines and large organic counterions are disclosed and used directly from solution in the manufacture of electronic devices.

4 Claims, No Drawings

SOLUBLE CONDUCTING POLYMERS AND THEIR USE IN MANUFACTURING ELECTRONIC DEVICES

This is a continuation of copending application(s) Ser. No. 7,608,714 filed on Nov. 5, 1990 now abandoned.

BACKGROUND OF THE INVENTION

1. Field of The Invention

This invention generally relates to electrically conductive polymer compositions and is particularly concerned with the use of such compositions in the manufacture of electronic devices.

2. Description of The Prior Art

Certain polymers, particularly polyaniline have attracted intense interest in their electrical properties. While these properties have great potential for adapting polyaniline to uses in molecular electronic devices, batteries, chemically modified electrodes and sensors, their insolubility, poor physical strength, and their chemical reactivity gives rise to such poor physical film characteristics that the use of these materials, particularly polyaniline, for manufacturing electronic devices has been severely inhibited.

Polyaniline is usually obtained by electrochemical polymerization. In fact, Wrighton, et. al. (Journal of the American Chemical Society, Vol. 106 pages 7389–7396, 1984) disclosed electrochemically polymerizing several different types of conducting polymers including polyaniline onto substrates. Wrighton furthermore demonstrated transistor action in the polymers. However, electrochemical polymerization onto substrates is limited because it requires a conductive substrate, and the morphology of the films are inconsistent.

One alternative, chemical polymerization onto substrates, has proven difficult to control and disadvantageously exposes the substrate to unwanted contaminants.

A. G. MacDiarmid, et. al. (Molecular Crystals and Liquid Crystals (1985) Volume 125, pages 309–318) disclosed that when aniline is polymerized using hydrochloric acid solution as the oxidants, a conducting polymer is obtained. The resulting polymer has the following formula:

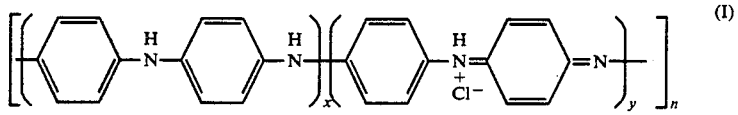

where $x = 1 - y$; $y = 1.0$ to $0.5$

This conducting polymer is green in color. Although polyaniline, made conductive with hydrochloric acid, has been employed in batteries (French Patent #1519729), it is too insoluble in organic solvents to be applied to substrates in any other fashion than electrochemical deposition, which of course, again, requires a conductive substrate. However, A. G. MacDiarmid, et. al. (Synthetic Metals, Volume 21 (1987) pages 21–30) did disclose casting films made from the insulating form of polyaniline dissolved in acetic acid. The insulating form of polyaniline is produced by treating the polyaniline with base to provide the following formula:

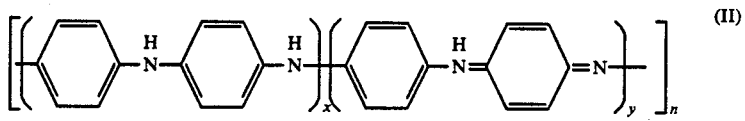

where $x = 1 - y$; $y = 1.0$ to $0.5$

This form of polymer takes on a blue color. U.S. Pat. No. 4,822,638 by Yaniger describes fabricating electronic devices from such insulating forms of polyaniline after doping the polymer with hydrochloric acid in order to chemically convert it to its conducting form after the insulating form has been coated onto the substrate.

In addition to the difficulty of controlling the polymerization and in addition to the potential exposure to unwanted contaminants, the insulating form is not substantially more soluble than the conductive form. Therefore, it was necessary to evaporate off large volumes of solvent from a very dilute solution. The remaining film is quite fragile and brittle, easily crumbling into a powder.

Accordingly, attempts have been made to produce the conducting form of polyaniline which could be applied to nonconductive substrates directly from solution.

Recently, Heeger (Synthetic Metals, Volume 32 (1989), page 263) disclosed a method for spin-coating polyaniline from sulfuric acid solution to form a conducting film. However, the method has a commercial drawback, in that, films spun from such a solvent will corrode metal substrates.

U.S. Pat. No. 4,798,685 by Yaniger disclosed polyanilines doped with electron acceptors such as alkyl halides to produce conductive polymers which were more soluble, more processable and which did not diffuse over time as compared to the hydrochloric acid polyaniline conducting polymers. Also U.S. Pat. No. 4,851,487 by Yaniger and Cameron disclosed anhydride-doped polyanilines. These recent polymers were also more soluble and thus more processable but, like Yaniger's earlier polymers, still fail to provide the film integrity needed to produce commercially acceptable electronic devices.

A polyaniline type conducting polymer, sufficiently soluble in organic solutions to be spun or cast onto either metal or polymer substrates as thick and commercially acceptable films, from which resistors and transistors or other electronic devices can be manufactured without loss of conductivity would represent a substantial advancement in the art and would satisfy a longfelt need.

SUMMARY OF THE INVENTION

It is therefore a principal object of the present invention to provide small geometry, electronic components from conducting polymers, applied directly to nonconductive substrates from organic solution, negating the need for electrochemical deposition and chemical polymerization directly onto the substrate.

It is a still further principal object of the present invention to provide conducting polymers which are substantially more soluble in organic solvents without having to use corrosive acids and without having to convert to the insulating base form.

These objects and others which will become more apparent from the following description of preferred embodiments, illustrative examples, and claims are fulfilled by short alkoxy chain-substituted polyanilines doped with large organic counterions.

This invention is, in part, made possible by the discovery that such compositions are surprisingly soluble to concentrations above about 3.0% (three percent) in organic solution. In a particularly preferred embodiment, the conducting polymer is even more soluble than its insulating polymer counterpart. Thus, film thicknesses achieved by spin-coating are unexpectedly high and more commercially acceptable.

DETAILED DESCRIPTION OF THE INVENTION AND PREFERRED EMBODIMENT

Conducting polymers of the present invention comprise substituted polyaniline, doped with large organic counterions.

Methoxy substitution of aniline is known to improve solubility of the hydrochloric acid conducting polymer of aniline. See Synthetic Metals, Volume 25, 1988, pages 235-242. However, the solubility of the conducting form is substantially less than the insulating form of such substituted polyanilines. Furthermore, the solubility of the conducting form is substantially less than that required to provide a commercially acceptable conductive film.

European Patent Application No. 88306489.1, by Kathirgamanathan, et. al. describes substitution of polyanilines with long alkoxy chains. Such substitution was said to provide conducting polymers soluble enough to be cast and coated as films, however, substitution sufficient enough to provide solubility, resulted in substantially ineffective and insufficient conductivity of the polymer for the purposes of producing electronic devices.

Doping with large organic counterions such as perchlorate has been disclosed in Synthetic Metals, Volume 30, 1989, page 199, and with toluene sulfonic acid, as disclosed in Synthetic Metals, Volume 20, 1987, pages 141 through 149. Although the solubility of such doped polymers was sufficient for analytical purposes, it was insufficient for conventional spin-coating or commercial casting operations. In fact, the resulting conducting polymers were substantially less soluble than their insulating counterparts.

In accordance with the present invention, it has been found that when the polyaniline is substituted with short alkoxy chains and thereafter doped with large counterions, particularly toluene sulfonic acid, the solubility of the resulting polymer in organic solution is equal to or in excess of about 3.0% (three percent) and in the case of doping with toluene sulfonic acid, the preferred embodiment of the present invention, the solubility of the conducting form, particularly in dimethylformamide (DMF), is substantially higher than the solubility of the insulating form in such solvent. This is highly unexpected.

In the process of the present invention aniline is substituted with o-methoxy, o-ethoxy, or o-propoxy. Preferably, the substitution is with short chain akoxy groups. It is particularly preferred to substitute the aniline with ortho methoxy in producing the orthoanisidine polymer.

The soluble conducting polymers may be prepared in one of two ways.

The preferred substituted aniline, orthoanisidine, can be polymerized to polyanisidine by combining the anisidine with an oxidant such as ammonium persulfate, hydrogen peroxide, perchloric acid, etc., in the presence of water or a solvent solution of the acid dopant, such as toluene sulfonic acid. The oxidant/monomer molar ratios can range from 0.5 and higher. The polyanisidine doped with toluene sulfonic acid precipitates from water and can be filtered out and washed with water to remove unused oxidant and acid. The polymer can then be dissolved in a solvent such as DMF in a concentration of 10% (ten percent) to give a highly viscous solution.

An alternative synthesis is to polymerize the substituted aniline in hydrochloric acid using an oxidant, then convert the resulting polyanisidine hydrochloride to its free base by deprotonation with base such as ammonium hydroxide. Then the free base is reacted with the desired acid dopant. Examples of such dopants are large organic counterions including protonic acids such as aryl sulfonic acids (toluene sulfonic acid), alkyl sulfonic acids (such as 2-acrylamido-2-methylpropane sulfonic acid, hereinafter called AMPS), and certain carboxylic acids, for example, oxalic acid and sulfonic acid esters such as methyl tosylates. Although Lewis acids and anhydrides may be employed, it is preferred to employ toluene sulfonic acid.

Care must be taken that the polymer is truly dissolved in solution, and is not merely a particle suspension. A suspension of particles, when spin-coated, will result in a matte black film in which particles can be seen visibly or under a microscope. To prevent this, the solution must be filtered through a filter of nominal size 0.45 micron prior to spinning.

Solubility of the polymer in solution can be determined by measuring the absorbance of the peak at 615 nanometers in the absorption spectrum. The procedure is as follows. First, the polymer is dissolved in the solvent of interest. Next, undissolved polymer is either filtered out or allowed to settle. A measured amount of the solution is quantitatively diluted with DMF made basic by adding 5%, 0.5 M $NH_4OH$. The presence of the base assures that all of the polyanisidine is converted to the blue insulating form, and an accurate correlation of concentration to absorption at 615 nm can made. The absorption is determined using a calibration curve previously prepared using known concentrations of polyanisidine. The concentration can then be calculated based on the dilutions that were made to achieve that value of absorption. The percentages that are reported here are based on the equivalent grams of polyanisidine base in solution (even though the polymer may actually be in the acid form). In this way, the relative weight of the counterions does not enter into the maximum concentration of solubility.

When 2-acrylamido-2-methylpropanesulfonic (AMPS) acid is used to dope the polyanisidine, the resulting polymer is soluble in DMF, and other solvents. The acrylic groups on the dopant can be polymerized to increase the strength of the film. Furthermore, the polymer is soluble in dimethylacrylamide and the resulting selection can be polymerized to form a conductive composite. Other compounds containing polymerizable groups such as acrylates could be added to modify the properties of the resulting composite.

Substituted polyaniline base, such as polyanisidine, can be spin-coated by adding a filler polymer to the solution. The filler polymer imparts improved mechanical properties to the film and increases the film thickness. The soluble conducting form of polyanisidine could also be blended with a second polymer to modify its properties, to increase strength or decrease moisture absorption, for instance. The polymers could be used to make conductive composites which would have the advantage over graphite or metal-filled composites in that the polyanisidine composite would not contain discrete particles.

Besides solubility constraints, the conductivity of the polymer must be in a useful range. In some cases, soluble polymers can be formed, but their conductivities are too low to be useful for the fabrication of electrical devices. Such is the case in European Patent Application 88306489.1, in which Kathirgamanathan, et. al. describe polyanilines that are substituted with long alkoxy chains. While some of these polymers are reported to be soluble in organic solvents, they have conductivities of approximately $10^{-7}$ S cm$^{-1}$, which is in the right range for antistatic applications, but not for electrical device applications.

The conductivity is typically measured in one of two ways: by a four-point probe method (see L. J. van der Pauw, Phillips Research Reports, vol. 13, no. 1-9 (1958) or by a two probe method. In most literature references, the measurements are conducted on pressed pellets or else films which have been electrochemically synthesized onto the substrate. (The polymers are not soluble enough to produce films any other way.) The bulk conductivity is expressed in MKS units as Siemens/cm (S/cm), which is equal to the reciprocal of the bulk resistivity in ohm- cm. The resistance of a thin film at a stated thickness is often expressed as the surface resistance in ohms/square, equal to the bulk resistivity divided by the film thickness. Fabrication of an 8 megaohm resistor with an aspect ratio of 4, for example, requires a conductivity of approximately $10^{-2}$ S/cm, equivalent to a resistivity of 100 ohm-cm, or for a 0.5 micron film, a surface resistance of 2 megaohms/square.

A further advantage of the present invention is that, in some cases, the polymer-based devices can have properties which cannot be produced through the use of inorganic materials. In particular, there are currently no satisfactory materials to make thin-film, small geometry resistors of megaohm values and above. Materials which are currently used for resistor fabrication consist of two types: resistor pastes and homogeneous inorganic materials such as polysilicon, metal silicides, and metal oxides. Resistor pastes which are used for large geometry hybrid resistors cannot be used for small ( 10 micron) geometries because the conducting component exists in the form of particles, creating a composition which is inhomogeneous on a scale less than 10 microns.

A number of inorganic materials are homogeneous, including polysilicon, metal silicides, and metal oxides, but these materials do not have high enough resistivities to make megaohm size and larger resistors, which are needed in some current-limiting applications such as synaptic connections for neural networks.

The conducting polymers in the present disclosure have conductivities in the range required to achieve high values of resistance using practical aspect ratios. These resistors could be used as temperature sensors by monitoring the change of resistance with temperature, or as chemical sensors by monitoring the change of resistance on exposure to a chemical species.

A further application is a spin-coatable semiconducting material for thin film transistors. Currently, multiple circuit layers are difficult to make because of the difficulty of growth of the semiconducting layer. The deposition and doping of polysilicon requires high temperature processing, which can damage lower layers of circuitry. A semiconductor which can be spun and patterned without the use of high temperature processes would allow many multiple layers of circuitry, ultimately limited by the density of interconnections.

The color of the spun films can be cycled from green to blue to green, as the film is exposed to acid or base. The green color corresponds to the conducting form and the blue color corresponds to the insulating form. This property could be used for optical switching, for electrochromic displays, or for acid or base sensing applications.

Other applications include protective coatings against static discharge and electromagnetic interference.

The following examples are illustrative of the present invention.

EXAMPLES

Example 1

Polyanisidine (5.0 grams) was dissolved in 150 milliliters of cold, 1M hydrochloric acid. The mixture was stirred in an ice bath during addition of solution of 13.7 grams of ammonium persulfate $(NH_4)_2S_2O_8$) in 75 milliliters of cold 1M HCl. Following addition of the ammonium persulfate, the solution was covered and place in the refrigerator at $-4$ C. for one hour. At that time the precipitate was filtered in a Buchner funnel, washed with water, then placed in 300 ml 0.5 M $NH_4OH$. The mixture was filtered, then placed in a second amount of 300 ml of 0.5 M $NH_4OH$. The mixture remained for one hour, at which time it was filtered and rinsed with water. The resulting polymer was the insulating polyanisidine free base. The polymer could either be used at this point, or dried under vacuum for future use.

Example 2

Wet polyanisidine free base (3 grams) produced in Example 1 was placed in 100 Ml of 2M Toluenesulfonic acid in water, and stirred. After 24 hours, the solids were filtered off and the polymer was rinsed with water on the filter paper. The resulting polymer was dissolved in dimethylformamide to give a solution of concentration of 7%.

The solution was spin-coated on top of a glass microscope slide which had been patterned with aluminum electrodes. The slide was baked on a hotplate at 130° C. for 60 seconds to remove solvent. The film thickness as measured by a Dektak surface profilometer was 0.37 micron. The resistance of the square of the film as measured between the electrodes was 0.38 megohms/square.

Example 3

The polyanisidine base was dissolved in dimethylformamide to give a concentration of 3%. It was blended with a 10% solution of poly(4-vinyl pyridine) in dimethylformamide in a ratio of 3:1 by weight (polyanisidine/polyvinyl pyridine solution). The polymer was spin-coated onto a slide and baked to remove solvent to give an insulating film. The slide was briefly dipped in a dilute solution of toluene sulfonic acid in methanol. The resulting resistance was 4.4 megaohms/square for 0.15 micron thick film.

TABLE I

Solubility and Spin-Coating Properties of Substituted Polyanilines

| | Polymer | Dopant | Solubility* | Film-Forming |
|---|---|---|---|---|
| 1. | Polyaniline | None | 0.5% (insulating form) | None |
| 2. | Polyaniline | HCL | insoluble | None |
| 3. | Polyaniline | TSA (toluene sulfonic acid) | 0.014% | None |
| 4. | Polyanisidine | None | 6% (insulating form) | Somewhat |
| 5. | Polyanisidine | HCL | 1.5% (blue in color) | Somewhat, but particulate and discontinuous. |
| 6. | Polyanisidine | AMPS | 3% | Somewhat |
| 7. | Polyanisidine | TSA | 10% (green in color) | Yes |

*Solubility is quantified as % of base form in solution, even if the polymer is in acid form.
Solubility = grams of base per 100 grams of solution.

As can be seen from polymers #6 and #7, the polymers of the invention provide surprisingly enhanced solubility and improved film morphology.

Example 4

The polymer prepared in Example 2 was dissolved to give a solution which had a concentration of 10%. This solution was spin-coated on glass slides patterned with electrodes and baked as above to give a film with thickness of 3.8 microns, with a resistance as measured above of 27 kiloohms/square.

Example 5

The polymer of Example 2 was spin-coated on top of cured polyimide (an insulator). The film was baked on a hot plate to remove solvent. Positive photoresist (AZ 1470J) was spun and patterned to give 15 micron patterns. The polyanisidine was then dry etched in a oxygen plasma to give 15 micron lines patterned across 7.5 micron spaces. The polymeric resistor had a resistance of 8 megaohms.

Example 6

The procedure of Example 1 was followed, except that aniline was polymerized. The molar proportion of oxidant to aniline was the same as in Example 1. The polyaniline base thus obtained was soluble in a concentration of 0.5% in dimethylformamide. The polyaniline base was converted to the doped form by reaction with toluene sulfonic acid solution as in Example 2. The resulting polymer has a solubility of 0.014% in dimethylformamide and did not produce intact films when spin-coated. The polymer did not exhibit the usual color changes on treatment with acid and base.

Example 7

The polyanisidine free base of Example 1 was placed in a solution of 1M 2-acrylamido-2-methylpropanesulfonic acid (AMPS) in water. After 24 hours, the solids were filtered and dissolved in tetrahydrofurfuryl alcohol to give a 3% solution. The solution was spin-coated onto glass slides to give a film of thickness 0.1 micron with resistance of 22 megaohms/square. The same polymer was soluble in dimethylacrylamide in a concentration of greater than 6%.

Example 8

Approximately 0.5 micrometer thick polyanisidine-TSA films were spun on top of gold electrodes. Films were baked to remove solvent. The resistance between the electrodes was measured as a function of temperature. The data were plotted as the natural log of the resistance versus the reciprocal of the temperature in order to conform to the typical temperature behavior of semiconductors:

$$Resistance(T) = A \exp(beta/T),$$

where beta as found to be equal to 979 K. The resistance-temperature behavior was repeatable when recycled over the temperature range 25° C.–100° C., demonstrating that the material could be used to sense temperature.

What is claimed is:
1. An improved method for making electronic devices, said method comprising
   a. doping short alkoxy chain substituted polyanilines with large organic counterions wherein the substitution constituent on the polyaniline is selected from the group consisting of o-methoxy, o-ethoxy, and o-propoxy, and the dopant is selected from the group consisting of sulfonic acids, carboxylic acids, and sulfonic esters;
   b. dissolving the resultant polymer in organic solution;
   c. filtering the solution to less than 0.45 microns through a filter of nominal size to prevent a particle suspension; and
   d. spin-coating the solution onto microelectronic substrates while in conductive form at a solubility of at least 3%;
   whereby, improved film characteristics, and improved processing are achieved negating the need for electrochemical deposition and chemical polymerization directly onto the substrate, and negating the need for corrosive acid solvents.

2. The method of claim 1 wherein the electronic device is a resistor having conductivity of approximately $10^{-2}$ S/cm.

3. The method of claim 1 wherein the dopant is toluene sulfonic acid.

4. The method of claim 1 wherein the substituted polyaniline is poly o-anisidine.

* * * * *